(12) United States Patent
Ozeki et al.

(10) Patent No.: US 10,280,273 B2
(45) Date of Patent: May 7, 2019

(54) GAS BARRIER MULTILAYER FILM

(71) Applicant: MITSUBISHI CHEMICAL CORPORATION, Chiyoda-ku (JP)

(72) Inventors: Kota Ozeki, Ushiku (JP); Tetsunori Takano, Tsuchiura (JP); Chiharu Okawara, Toride (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 86 days.

(21) Appl. No.: 15/327,491

(22) PCT Filed: Jul. 23, 2015

(86) PCT No.: PCT/JP2015/070997
§ 371 (c)(1),
(2) Date: Jan. 19, 2017

(87) PCT Pub. No.: WO2016/013624
PCT Pub. Date: Jan. 28, 2016

(65) Prior Publication Data
US 2017/0166718 A1   Jun. 15, 2017

(30) Foreign Application Priority Data

Jul. 25, 2014   (JP) ................................. 2014-152423
Oct. 31, 2014   (JP) ................................. 2014-223275

(51) Int. Cl.
| | |
|---|---|
| *C08J 7/04* | (2006.01) |
| *C09D 175/04* | (2006.01) |
| *C23C 16/40* | (2006.01) |
| *C23C 16/56* | (2006.01) |
| *C23C 14/10* | (2006.01) |
| *C23C 14/58* | (2006.01) |
| *B32B 9/00* | (2006.01) |
| *B32B 27/00* | (2006.01) |
| *B32B 27/40* | (2006.01) |
| *C08K 5/5415* | (2006.01) |
| *C23C 16/42* | (2006.01) |
| *C08L 75/04* | (2006.01) |

(52) U.S. Cl.
CPC ................ *C08J 7/045* (2013.01); *B32B 9/00* (2013.01); *B32B 27/00* (2013.01); *B32B 27/40* (2013.01); *C08K 5/5415* (2013.01); *C08L 75/04* (2013.01); *C09D 175/04* (2013.01); *C23C 14/10* (2013.01); *C23C 14/58* (2013.01); *C23C 16/401* (2013.01); *C23C 16/42* (2013.01); *C23C 16/56* (2013.01); *C08J 2367/02* (2013.01); *C08J 2475/04* (2013.01)

(58) Field of Classification Search
CPC . B32B 27/00; B32B 27/40; B32B 9/00; C08J 2367/02; C08J 2475/04; C08J 7/045; C08K 5/5415; C08L 75/04; C09D 175/04; C23C 14/10; C23C 14/58; C23C 16/401; C23C 16/42; C23C 16/56

USPC ....................................................... 428/425.5
See application file for complete search history.

(56) References Cited

U.S. PATENT DOCUMENTS

| | | | | |
|---|---|---|---|---|
| 6,569,533 B1* | 5/2003 | Uchida | ............... | C08G 18/0823 428/423.1 |
| 2002/0168515 A1* | 11/2002 | Murata | ................ | C08G 18/289 428/343 |
| 2007/0224402 A1* | 9/2007 | Yoshida | .................. | B32B 27/08 428/220 |
| 2007/0269664 A1 | 11/2007 | Fujii et al. | | |
| 2010/0159183 A1 | 6/2010 | Nishimura | | |
| 2011/0129654 A1 | 6/2011 | Yoshida et al. | | |

FOREIGN PATENT DOCUMENTS

| | | |
|---|---|---|
| CN | 1922005 A | 2/2007 |
| CN | 101039801 A | 9/2007 |
| CN | 101681216 A | 3/2010 |
| CN | 101802122 A | 8/2010 |
| CN | 102069617 A | 5/2011 |
| EP | 1 728 622 A1 | 12/2006 |
| JP | 2000-167973 A | 6/2000 |
| JP | 2001-47546 | 2/2001 |
| JP | 2002-370749 | 12/2002 |
| JP | 2003-129030 A | 5/2003 |
| JP | 2004-160815 | 6/2004 |
| JP | 2004-160823 | 6/2004 |

(Continued)

OTHER PUBLICATIONS

Combined Office Action and Search Report dated Apr. 2, 2018 in Chinese Patent Application No. 201580039995.5 (with English translation of categories of cited documents) 8 pages.

Extended Search Report dated Nov. 8, 2017 in European Patent Application No. 15824187.7.

(Continued)

*Primary Examiner* — Thao T Tran

(74) *Attorney, Agent, or Firm* — Oblon, McClelland, Maier & Neustadt, L.L.P.

(57) ABSTRACT

Provided is a gas barrier laminate film capable of realizing excellent gas barrier property, water resistance, and adhesiveness, having a plastic substrate (A), a silicon oxide layer (B) formed on at least one surface of the plastic substrate (A), and a coat layer (C) formed by applying a coating solution onto a surface of the silicon oxide layer (B), wherein the coating solution comprises a mixture of a polyurethane-based resin (c1) and a silane coupling agent (c2) and contains a reaction product of (c1) with (c2) as a main component; and a number-average molecular weight of the reaction product is in the range of 100,000 to 1,000,000.

13 Claims, No Drawings

(56) References Cited

FOREIGN PATENT DOCUMENTS

| | | |
|---|---|---|
| JP | 2006-68967 A | 3/2006 |
| JP | 2008-143582 A | 6/2008 |
| JP | 2010-221595 A | 10/2010 |
| WO | 2007/018239 A1 | 2/2007 |

OTHER PUBLICATIONS

International Search Report dated Sep. 8, 2015 in PCT/JP2015/070997 filed Jul. 23, 2015.
Office Action in corresponding Chinese Patent Application No. 201580039995.5 dated Dec. 4, 2018. (w/English Translation).

* cited by examiner

GAS BARRIER MULTILAYER FILM

TECHNICAL FIELD

The present invention relates to a laminate film excellent in a gas barrier property for the use including various wrapping uses.

BACKGROUND ART

Conventionally, a gas barrier plastic film which uses a plastic film as a substrate and has an inorganic layer of silicon oxide, aluminum oxide, magnesium oxide, or the like formed on the surface thereof is widely used for wrapping of articles which require blocking of various gases such as water vapor and oxygen, for example, for wrapping to avoid deterioration of foods, industrial goods, drugs, and the like. With regard to the gas barrier plastic film, in addition to the wrapping use, in recent years, new uses have been receiving attention, which include a vacuum insulating material and a transparent conductive sheet to be used for a liquid crystal display device, a solar cell, an electromagnetic wave shield, a touch panel, a substrate for EL, a color filter, and the like.

With regard to the gas barrier plastic film formed with the inorganic layer, various improvement methods have been studied with an aim to avoid deterioration of the gas barrier property or to further enhance the gas barrier property. For example, disclosed are: a method in which a film material excellent in the gas barrier property is obtained by using a polyurethane-based resin having specific concentrations of a urethane group and a urea group (see, PTL 1); and a method in which an anchor coat layer comprising a urethane resin is formed at least one surface of a film to obtain a film for a vapor deposition (see, PTL 2).

Though the gas barrier property can be improved to some extent in these methods, film, and the like, however, the gas barrier property is still insufficient under a severe treatment condition represented by, for example, a treatment with a pressurized hot water; and therefore, the improvement thereof has been wanted.

CITATION LIST

Patent Literature

PTL 1: JP 2003-129030 A
PTL 2: WO 2007/018239 A

SUMMARY OF INVENTION

Technical Problem

The problem to be solved by the present invention is to provide a film excellent in the gas barrier property from the time immediately after the production thereof while keeping this excellent gas barrier property, as well as excellent in the resistance to a hot water.

Solution to Problem

Inventors of the present invention found that the problem can be solved by a gas barrier laminate film having a resin layer that is formed by applying an aqueous dispersion solution, which is a mixture of a polyurethane-based resin and a silane coupling agent, on a surface of a silicon oxide thin film formed on at least one surface of a plastic substrate. The present invention could be achieved on the basis of this finding.

Namely, the present invention relates to following (1) to (9).

(1) A gas barrier laminate film, wherein the gas barrier laminate film has a plastic substrate (A), a silicon oxide layer (B) formed on at least one surface of the plastic substrate (A), and a coat layer (C) formed by applying a coating solution onto a surface of the silicon oxide layer (B); the coating solution comprises a mixture of a polyurethane-based resin (c1) and a silane coupling agent (c2) and contains a reaction product of (c1) with (c2) as a main component; and a number-average molecular weight of the reaction product is in the range of 100,000 to 1,000,000.

(2) A gas barrier laminate film, wherein the gas barrier laminate film has a plastic substrate (A), a silicon oxide layer (B) formed on at least one surface of the plastic substrate (A), and a coat layer (C) formed by applying a coating solution onto a surface of the silicon oxide layer (B); the coating solution comprises a mixture of a polyurethane-based resin (c1) and a silane coupling agent (c2) and contains a reaction product of (c1) with (c2) as a main component; and an oxygen permeability is 5 mL/m$^2$/24-hours/MPa or less.

(3) The gas barrier laminate film according to (1) or (2), wherein the polyurethane-based resin (c1) is obtained by a reaction of a polyol and a polyisocyanate, and the polyisocyanate is at least one kind selected from xylylene diisocyanate and hydrogenated xylylene diisocyanate.

(4) The gas barrier laminate film according to any one of (1) to (3), wherein the coating solution is a mixture of the polyurethane-based resin (c1) and the silane coupling agent (c2) with a mass ratio of in the range of 99/1 to 80/20.

(5) The gas barrier laminate film according to any one of (1) to (4), wherein the silane coupling agent (c2) is at least one kind selected from an epoxy group-containing silane compound and an amino group-containing silane compound.

(6) The gas barrier laminate film according to any one of (1) to (5), wherein the silicon oxide layer (B) is formed by a physical vapor deposition method or a chemical vapor deposition method.

(7) The gas barrier laminate film according to any one of (1) to (6), wherein an anchor coat layer is formed between the plastic substrate (A) and the silicon oxide layer (B).

(8) The gas barrier laminate film according to (7), wherein the anchor coat layer is formed by at least one resin selected from a polyester-based resin, a polyurethane-based resin, an acryl-based resin, and an oxazoline group-containing resin.

(9) The gas barrier laminate film according to any one of (1) to (8), wherein a water vapor permeability is 0.5 g/m$^2$/24-hours or less.

Advantageous Effects of Invention

The gas barrier film of the present invention is excellent in the gas barrier property from the time immediately after the production thereof while keeping this excellent gas barrier property, as well as excellent in the resistance to a hot water, so that the film is excellent in the gas barrier property and the adhesion strength after a retort treatment.

DESCRIPTION OF EMBODIMENTS

Hereunder, the present invention will be explained in detail.

(First Embodiment of the Present Invention)

The first embodiment of the present invention is characterized by that the gas barrier laminate film has a plastic substrate (A), a silicon oxide layer (B) formed on at least one surface of the plastic substrate (A), and a coat layer (C) formed by applying a coating solution onto a surface of the silicon oxide layer (B); the coating solution comprises a mixture of a polyurethane-based resin (c1) and a silane coupling agent (c2) and contains a reaction product of (c1) with (c2) as a main component; and a number-average molecular weight of the reaction product is in the range of 100,000 to 1,000,000.

Although a reason is not clear, when the number-average molecular weight of the reaction product between the polyurethane-based resin (c1) and the silane coupling agent (c2) is in the range of 100,000 to 1,000,000, the barrier property can be enhanced. The number-average molecular weight thereof is preferably in the range of 100,000 to 500,000, more preferably in the range of 100,000 to 400,000, while still more preferably in the range of 150,000 to 350,000. Meanwhile, the number-average molecular weight is the value obtained by the method described in Examples.

In the gas barrier laminate film of this embodiment, the oxygen permeability measured by the method described in Examples is preferably 25 mL/m$^2$/24-hours/MPa or less, more preferably 20 mL/m$^2$/24-hours/MPa or less, still more preferably 10 mL/m$^2$/24-hours/MPa or less, further still more preferably 5 mL/m$^2$/24-hours/MPa or less, especially preferably 4 mL/m$^2$/24-hours/MPa or less, while further especially preferably 2 mL/m$^2$/24-hours/MPa or less. Also the water vapor permeability measured by the method described in Example is preferably 5 g/m$^2$/24-hours or less, more preferably 2 g/m$^2$/24-hours or less, still more preferably 0.5 g/m$^2$/24-hours or less, while especially preferably 0.3 g/m$^2$/24-hours or less.

(Second Embodiment of the Present Invention)

The second embodiment of the present invention is characterized by that the gas barrier laminate film has a plastic substrate (A), a silicon oxide layer (B) formed on at least one surface of the plastic substrate (A), and a coat layer (C) formed by applying a coating solution onto a surface of the silicon oxide layer (B); the coating solution comprises a mixture of a polyurethane-based resin (c1) and a silane coupling agent (c2) and contains a reaction product of (c1) with (c2) as a main component; and an oxygen permeability is 5 mL/m$^2$/24-hours/MPa or less. The oxygen permeability is preferably 4 mL/m$^2$/24-hours/MPa or less, while more preferably 2 mL/m$^2$/24-hours/MPa or less.

Unless otherwise specified, description with regard to the following embodiments is common in the first embodiment and the second embodiment.

Meanwhile, in this specification, the term "main component" means that other component may be contained so far as the actions and effects of the gas barrier laminate film of the present invention are not impaired. Further, although this term does not restrict a specific content thereof, the component occupies 50% or more by mass, preferably 65% or more by mass, while more preferably in the range of 80 to 100% by mass, both inclusive, in the entirety of the constituting components of the resin composition to constitute each layer.

The plastic substrate of the gas barrier laminate film of the present invention is preferably a thermoplastic resin film; and as the raw material thereof, any resin capable of being used for ordinary wrapping materials may be used without any particular restriction. Specific example thereof includes: a polyolefin such as a homopolymer or a copolymer of ethylene, propylene, butene, or the like; an amorphous polyolefin such as a cyclic polyolefin; a polyester such as polyethylene terephthalate and polyethylene 2,6-naphthalate; a polyamide such as nylon 6, nylon 66, nylon 12, and copolymer nylon; as well as a polyvinyl alcohol, a partially hydrolyzed product of ethylene-vinyl acetate copolymer (EVOH), a polyimide, a polyether imide, a polysulfone, a polyether sulfone, a polyether ether ketone, a polycarbonate, a polyvinyl butyral, a polyarylate, a fluorinated resin, an acrylate resin, and a biodegradable resin. Among them, a polyester, a polyamide, and a polyvinyl alcohol are preferable in view of the film strength, the cost, and the like. The plastic substrate may contain any heretofore known additive, for example, an antistatic agent, a light cutoff agent, a UV absorber, a plasticizer, a lubricant, a filler, a colorant, a stabilizer, a lubricating agent, a crosslinking agent, a blocking inhibitor, an antioxidant, and the like.

The thermoplastic resin film as the plastic substrate may be formed with the material mentioned above as the main component thereof, and in the case when the film is used as the substrate, it may be an unstretched film or a stretched film. Also, the film may be laminated with other plastic substrate. The plastic substrate of this type can be produced according to a heretofore known method. For example, a raw material resin is melted in an extruder and extruded out through a ring die or a T die, and then rapidly cooled, so that a substantially amorphous and un-oriented, unstretched film can be produced. The unstretched film thus obtained may be stretched according to a heretofore known method including a monoaxial stretching method, a tenter-assisted successive biaxial stretching method, a tenter-assisted simultaneous biaxial stretching method, and a tubular-type simultaneous biaxial stretching method, in the flow (longitudinal) direction of the film or in the direction perpendicular to the flow direction (lateral direction) direction of the film, thereby giving a film that has been at least monoaxially stretched. The thickness of the plastic substrate may be selected generally from the range of 5 to 500 μm, while preferably from the range of 10 to 200 μm, in view of the mechanical strength, the flexibility, the transparency, and the like and in accordance with the use as the substrate of the gas-barrier laminate film of the present invention, while the plastic substrate includes a thick sheet-like film. The width and the length of the film are not particularly restricted, and may be arbitrarily selected in accordance with the use thereof.

Meanwhile, in the plastic substrate, in order to improve the adhesiveness with the silicon oxide layer, it is preferable to form an anchor coat layer between the plastic substrate and the silicon oxide layer by applying an anchor coat material. The anchor coat material usable is a solvent-based material or a water-based material, wherein preferable example thereof includes a polyester-based resin, a polyurethane-based resin, an acryl-based resin, a vinyl alcohol resin, an ethylene-vinyl alcohol resin, a vinyl-modified resin, an oxazoline group-containing resin, a carbodiimide group-containing resin, an epoxy group-containing resin, an isocyanate group-containing resin, an alkoxyl group-containing resin, a modified styrene resin, and a modified silicone resin; these may be used singly or as a combination of two or more of them. In particular, in view of the adhesiveness and the hot water resistance, preferable resins to be used are a polyester-based resin, a polyurethane-based resin, an acryl-based resin, an oxazoline group-containing resin, a carbodiimide-containing resin, an epoxy group-containing resin, an isocyanate group-containing resin, as well as at least one resin selected from these resins; more preferable is a use thereof as a combination of one or more resins selected from a polyester-based resin, a polyurethane-based resin, and an acryl-based resin with one or more resins selected from an oxazoline group-containing resin, a carbodiimide group-containing resin, an epoxy group-containing resin, and an isocyanate group-containing resin.

The thickness of the anchor coat layer is generally in the range of 0.005 to 5 µm, while preferably in the range of 0.01 to 1 µm. Falling within this range is preferable because the anchor coat layer can have good lubricity and hardly delaminates from the plastic substrate owing to the internal stress inside the anchor coat layer itself, and in addition, the layer can keep a uniform thickness.

In addition, in order to enhance the applicability of the anchor coat material to the plastic substrate and the adhesiveness therebetween, the plastic substrate may be surface-treated through an ordinary chemical treatment or discharge treatment, or the like, prior to application of the anchor coat material.

The silicon oxide layer formed on at least one surface of the plastic substrate contains silicon oxide as a main component, and may further contain silicon carbide, silicon nitride, diamond-like carbon, or the like.

With regard to the method for forming the silicon oxide layer, any method including a vapor deposition method and a coating method may be used; however, a vapor deposition method is preferable because a uniform, thin film having an excellent gas barrier property can be obtained with this method. Illustrative example of the vapor deposition method includes a PVD (physical gas phase vapor deposition method, which is sometimes referred to as a physical vapor deposition method) such as a vacuum vapor deposition method, an ion plating method, and a spattering method; as well as a CVD (chemical gas phase vapor deposition method, which is sometimes referred to as a chemical vapor deposition method).

The thickness of the silicon oxide layer is generally in the range of 0.1 to 500 nm, while preferably in the range of 0.5 to 40 nm. Falling within this range, a sufficient gas barrier property can be obtained; and in addition, an excellent transparency can be obtained without causing a crack or delamination in the silicon oxide layer.

Hereunder, the coating solution, which is a mixture of a polyurethane-based resin (c1) and a silane coupling agent (c2) and contains a reaction product of (c1) with (c2) as a main component, will be explained.

Polyurethane-based Resin (c1)

The polyurethane-based resin of the present invention is obtained by a urethane-forming reaction between a polyisocyanate component and a polyol component, and further with a polyamine component if necessary. The polyisocyanate is especially preferable when it is at least one kind selected from xylylene diisocyanate and hydrogenated xylylene diisocyanate.

[Polyisocyanate Component]

Illustrative example of the polyisocyanate component includes an aromatic diisocyanate, an aromatic aliphatic diisocyanate, an alicyclic diisocyanate, and an aliphatic diisocyanate.

Illustrative example of the aromatic diisocyanate includes: m- or p-phenylene diisocyanate or a mixture of them; 4,4'-diphenyl diisocyanate, 1,5-naphthalene diisocyanate (NDI); 4,4'-, 2,4'-, or 2,2'-diphenylmethane diisocyanate or a mixture of them (MDI); 2,4- or 2,6-tolylene diisocyanate or a mixture of them (TDI); as well as 4,4'-toluidine diisocyanate (TODI) and 4,4'-diphenyl ether diisocyanate.

Illustrative example of the aromatic aliphatic diisocyanate includes: 1,3- or 1,4-xylylene diisocyanate or a mixture of them (XDI); 1,3- or 1,4-tetramethyl xylylene diisocyanate or a mixture of them (TMXDI); and ω,ω'-diisocyanate-1,4-diethylbenzene.

Illustrative example of the alicyclic diisocyanate includes: 1,3-cyclopentene diisocyanate, 1,4-cyclohexane diisocyanate, 1,3-cyclohexane diisocyanate, 3-isocyanatemethyl-3,5,5-trimethylcyclohexylisocyanate (isophorone diisocyanate; IPDI); 4,4'-, 2,4'-, or 2,2'-dicyclohexylmethane diisocyanate or a mixture of them (hydrogenated MDI); methyl-2,4-cyclohexane diisocyanate and methyl-2,6-cyclohexane diisocyanate; and 1,3- or 1,4-bis(isocyanatemethyl) cyclohexane or a mixture of them (hydrogenated XDI).

Illustrative example of the aliphatic diisocyanate includes: trimethylene diisocyanate, tetramethylene diisocyanate, hexamethylene diisocyanate (HDI), pentamethylene diisocyanate, 1,2-propylene diisocyanate; 1,2-, 2,3-, or 1,3-butylene diisocyanate; 2,4,4- or 2,2,4-trimethylhexamethylene diisocyanate; and methyl 2,6-diisocyanatocaproate.

Among these diisocyanate components, preferable example of the diisocyanate includes: TDI, MDI, and NDI as the aromatic diisocyanate; XDI and TMXDI as the aromatic aliphatic diisocyanate; IPDI, hydrogenated XDI, and hydrogenated MDI as the alicyclic diisocyanate; and HDI as the aliphatic diisocyanate. In view of the gas barrier property, the aromatic diisocyanates (such as TDI, MDI, and NDI), the aromatic aliphatic diisocyanates (such as XDI and TMXDI), and the alicyclic diisocyanates (such as IPDI, hydrogenated XDI, and hydrogenated MDI) are preferable; especially, the aromatic diisocyanates (such as MDI), the aromatic aliphatic diisocyanates (such as XDI), and the alicyclic diisocyanates (such as hydrogenated XDI) are preferable. Further, in the diisocyanate component having a substituent group in the ring thereof, the side chain of the aromatic ring or the aliphatic ring is preferably a short chain (for example, a $C_{1-3}$ alkyl group); and the diisocyanate component is preferably symmetrical in the structure thereof.

These diisocyanate components may be used singly or as a combination of two or more of them. In addition, a polyisocyanate having 3 or more functional groups may be concurrently used if necessary.

[Polyol Component]

With regard to the polyol component, a wide range of diol from a low-molecular weight diol to an oligomer may be mentioned; and illustrative example thereof includes: a low-molecular weight diol component such as $C_{2-12}$ alkylene glycols (for example, ethylene glycol, 1,3- or 1,2-propylene glycol, 1,4-, 1,3-, or 1,2-butanediol, 1,5-pentanediol, 3-methyl-1,5-pentanediol, 2,4-diethyl-1,5-pentanediol, 2,2,4-trimethylpentane-1,3-diol, 1,6-hexanediol, neopentyl glycol, 1,5- or 1,7-heptanediol, 1,8-octanediol, 1,9-nonanediol, 1,10-decanediol, 1,11-undecanediol, 1,12-dodecanediol, and the like), polyether diols such as polyoxy $C_{2-4}$ alkylene glycols (for example, diethylene glycol, triethylene glycol, tetraethylene glycol, pentaethylene glycol, hexaethylene glycol, heptaethylene glycol, dipropylene glycol, tripropylene glycol, tetrapropylene glycol, pentapropylene glycol, hexapropylene glycol, heptapropylene glycol, dibutylene glycol tributylene glycol, tetrabutylene glycol, and the like), aromatic diols (for example, bisphenol A, bishydroxyethyl terephthalate, catechol, resorcin, hydroquinone, 1,3- or 1,4-xylylene diol or a mixture of them, and the like), aliphatic diols (for example, hydrogenated bisphenol A, hydrogenated xylylene diol, cyclohexane diol, cyclohexane dimethanol, and the like); as well as polyester diols (for example, a product of an addition reaction of the foregoing low-molecular weight diol with a lactone, a reaction product of the foregoing low-molecular weight diol with a dicarboxylic acid, and the like), and polycarbonate diol (for example, a reaction product of the foregoing low-molecular weight diol with a short-chain dialkyl carbonate).

The molecular weight of the diol component is usually in the range of 50 to 600, preferably in the range of 50 to 300, while more preferably in the range of about 60 to about 200.

In view of the gas barrier property, among these diol components, low-molecular weight diol components such as $C_{2-8}$ diols (for example, ethylene glycol, propylene glycol, butanediol, pentanediol, hexanediol, heptanediol, octanediol, diethylene glycol, triethylene glycol, tetraethylene glycol, dipropylene glycol, and the like) are usually used, while $C_{2-6}$ diols (especially ethylene glycol, 1,2- or 1,3-propylene glycol, 1,4-butanediol, 1,6-hexanediol, 3-methyl-1,5-pentanediol, diethylene glycol, triethylene glycol, dipropylene glycol, and the like) are preferably used.

These diol components may be used singly or as a combination of two or more of them. In addition, a polyol having 3 or more functional groups may be concurrently used if necessary.

[Polyamine Component]

If necessary, a polyamine component may be used as a chain elongating agent or a crosslinking agent. Illustrative example of the polyamine includes hydrazine, aliphatic diamines (for example, ethylene diamine, trimethylene diamine, tetramethylene diamine, pentamethylene diamine, hexamethylene diamine, 2,2,4-trimethylhexamethylene diamine, 2,4,4-trimethylhexamethylene diamine, octamethylene diamine, and the like), aromatic diamine (for example, m- or p-phenylene diamine, 1,3- or 1,4-xylylene diamine, or a mixture of them, and the like), alicyclic diamines [for example, hydrogenated xylene diamine, bis(4-aminocyclohexyl)methane, isophorone diamine, bis(4-amino-3-methylcyclohexyl)methane, and the like], as well as hydroxyl group-containing diamines such as 2-hydrazinoethanol and 2-[(2-aminoethyl)amino]ethanol.

In view of the gas barrier property, among these diamine components, a low-molecular weight diamine component having 8 or less carbon atoms is usually used, while a diamine having 6 or less carbon atoms is preferably used (especially, hydrazine, ethylene diamine, tetramethylene diamine, pentamethylene diamine, hexamethylene diamine, 2-hydrazinoethanol, 2-[(2-aminoethyl)amino]ethanol, and the like).

These diamine components may be used singly or as a combination of two or more of them. In addition, a polyamine component having 3 or more functional groups may be concurrently used if necessary.

[Production Method]

For production of the polyurethane-based resin, an ordinary method in which a urethane-forming reaction is carried out in an organic solvent can be used. The organic solvent is not particularly restricted so far as the solvent is inert to the reaction, wherein illustrative example thereof includes ethers (such as tetrahydrofuran and dioxane), ketones (such as acetone and methyl ethyl ketone), aromatic hydrocarbons (such as toluene and xylene), nitriles (such as acetonitrile), carbonate esters (such as dimethyl carbonate and diethyl carbonate), amides (such as dimethylformamide and dimethylacetamide), and sulfoxides (such as dimethyl sulfoxide). These organic solvents may be used singly or as a mixture of two or more of them. An organic solvent capable of dissolving the polyurethane-based resin is usually used.

In addition, in the urethane-forming reaction, an urethane-forming catalyst such as an amine-based catalyst, a tin-based catalyst, and a lead-based catalyst may also be used if necessary.

With regard to the ratio of the diisocyanate component to the diol component (when a diamine component is used, sum of the diol component and the diamine component), amount of the diol component (the diol component and diamine component) may be selected from the range of 0.5 to 1.5 moles, preferably from the range of 0.7 to 1.3 moles, while more preferably from the range of about 0.85 to about 1.15 moles, relative to 1 mole of the diisocyanate.

The polyurethane-based resin may be in any of the forms: a solution in the foregoing organic solvent, an aqueous solution, or an aqueous dispersion solution (aqueous dispersion body) of the polyurethane-based resin. The aqueous dispersion solution may be prepared by emulsion-dispersion of a polyurethane prepolymer followed by elongating the chain thereof by a chain elongating agent such as the diamine component.

If the polyurethane prepolymer does not have a hydrophilic group, usually, the polyurethane prepolymer is emulsified by an emulsifying agent followed by elongating the chain thereof by the chain elongating agent to obtain the aqueous dispersion solution.

Illustrative example of the emulsifying agent includes: water-soluble polymer type protective colloids such as polyvinyl alcohol, cellulose derivatives (for example, carboxymethyl cellulose and the like), gelatin, and dextrin; nonionic surfactants including polyoxyethylene-oxypropylene block copolymer and polyoxyethylene $C_{8-20}$ alkylphenyl ethers such as polyoxyethylene nonylphenyl ether; and anionic surfactants including alkaline metal salts of $C_{8-20}$ alkylsulfate such as sodium laurylsulfate and alkaline metal salts of $C_{8-20}$ alkylbenzene sulfonate including sodium dodecylbenzene sulfonate.

The use amount of the emulsifying agent is, in terms of solid content, in the range of 0.1 to 20 parts by mass (for example in the range of 1 to 20 parts by mass), preferably in the range of 1 to 15 parts by mass, while more preferably in the range of about 3 to about 10 parts by mass, relative to 100 parts by mass of the polyurethane prepolymer.

In the case that the polyurethane prepolymer has a hydrophilic group, the aqueous dispersion solution can be prepared, for example, as following: a hydrophilic compound is used as at least a part of the diol component (or the diamine component) to carry out the reaction with an isocyanate compound to introduce the hydrophilic group into the polyurethane prepolymer, which is then followed by dispersing thus treated polyurethane prepolymer into water, and further followed by chain-elongation using the chain-elongation agent such as the diamine component. Illustrative example of the hydrophilic group includes ionic dissociable groups (for example, a carboxyl group, a sulfonic acid group, a sulfonate group, a carbamoyl sulfonate group, a quaternary amino group or a quaternary ammonium salt, and the like), and nonionic groups [for example, a polyoxyalkylene group (for example, polyoxyethylene group and the like), an epoxy group, and the like]. Among these hydrophilic groups, anionic groups (a carboxyl group, a sulfonic acid group, a sulfonate group, and a carbamoyl sulfonate group) and the nonionic group (polyoxyethylene group) are preferable, while the anionic groups (a carboxyl group and a sulfonic acid group) are especially preferable. Further, in order to dissolve or disperse the prepolymer that is introduced with an anionic hydrophilic group such as the carboxyl group and the sulfonic acid group, it is preferable that the chain elongation be carried out after the anionic hydrophilic group is neutralized by a neutralizing agent.

The hydrophilic compound has in its molecule a hydrophilic group and a reactive group to the isocyanate group. Illustrative example of the reactive group to the isocyanate group includes a hydroxyl group, an amino group, and a mercapto group. Illustrative example of the hydrophilic compound includes: carboxyl group-containing compounds such as a reaction product of a compound having the reactive group to the isocyanate group (a dihydroxy compound such as a diol, a diamine, or the like) with a dihydroxy carboxylic acid (for example, a dihydroxy $C_{2-10}$ carboxylic acid such as 2,2-dimethylolpropionic acid, 2,2-dimethylolbutanoic acid, and 2,2-dimethylolvaleric acid; a dihydroxy $C_{4-10}$ polyvalent carboxylic acid such as dioxymaleic acid; and a dihydroxy aromatic carboxylic acid such as 2,6-dihydroxybenzoic acid), a diaminocarboxylic acid (for example, a diaminoaromatic carboxylic acid such as 3,4-diaminobenzoic acid), an acid anhydride (for example, maleic anhydride, phthalic anhydride, succinic anhydride, trimellitic anhydride, and pyromellitic anhydride), or oligoester polyols obtained by copolymerizing these carboxyl group-containing compounds; sulfonic acid group-containing compounds such as oxysulfonic acids (for example, 2-oxyethanesulfonic acid and phenolsulfonic acid), sulfocarboxylic acids (for example, sulfobenzoic acid, sulfosuccinic acid, and 5-sulfoisophthalic acid), amino group-containing sulfonic acids (for example, sulfanyl acid, 1,3-phenylenediamine-4,6-disulfonic acid, and 2,4-diaminotoluene-5-sulfonic acid), or oligoester polyols obtained by copolymerizing these sulfonic acid group-containing compounds; polyoxy $C_{2-4}$ alkylene compounds having the reactive group to the isocyanate group (for example, a compound having 30% or more by mass of an ethylene oxide unit with the number-average molecular weight of in the range of about 300 to about 10,000), or oligoester ether polyols obtained by copolymerizing these polyoxyalkylene compounds. These hydrophilic compounds may be used singly or as a combination of two or more of them.

The ratio of the hydrophilic compound may be selected from the range of 1 to 100% by mole, preferably from the range of 5 to 70% by mole (for example, from the range of 5 to 50% by mole), while more preferably from the range of about 10 to about 40% by mole, relative to the diol component and/or the diamine component.

The neutralization agent can be selected depending on the kind of the hydrophilic group. In the case that the hydrophilic group is an anionic group, illustrative example thereof includes inorganic bases (for example, alkaline metal hydroxides such as sodium hydroxide and potassium hydroxide; alkaline earth metal hydroxides such as calcium hydroxide and magnesium hydroxide; alkaline metal carbonate salts such as sodium carbonate and potassium carbonate; alkaline metal hydrogen carbonate salts such as sodium hydrogen carbonate; and ammonia) and organic bases (mono-, di-, or tri-$C_{1-4}$ alkylamines such as trimethylamine and triethylamine; and mono-, di-, or tri-$C_{1-4}$ alkanolamines such as monoethanolamine, diethanolamine, and triethanolamine). These neutralization agents may be used singly or as a combination of two or more of them.

In view of the gas barrier property and the water resistance, the aqueous dispersion solution of the polyurethane-based resin is preferably the dispersion solution of a soap-free type resin which does not contain a free surfactant (for example, the resin obtained by dispersing the prepolymer which is introduced with the hydrophilic group followed by the chain elongation of thus dispersed prepolymer).

The solvent of the aqueous dispersion solution is not limited to water alone, so that a mixed solvent of water with a water-soluble solvent (for example, $C_{1-4}$ alcohols such as methanol, ethanol, and isopropanol; ketones such as acetone; and cellosolves) may be used. Meanwhile, in preparation of the aqueous dispersion solution, the organic solvent may be displaced with water by a conventional solvent displacing method, for example, by a method in which displacement with water is carried out by distilling out the organic solvent.

[Characteristic of the Polyurethane-based Resin]
(Concentration of the Urethane Group and Concentration of the Urea Group)

In the polyurethane-based resin of the present invention, the sum of the concentration of the urethane group and the concentration of the urea group is preferably 15% or more by mass (for example, in the range of 20 to 60% by mass), more preferably 20% or more by mass (for example, in the range of 30 to 60% by mass), while still more preferably in the range of about 35 to about 60% by mass (especially, in the range of 35 to 55% by mass). It is preferable that the sum of the concentration of the urethane group and concentration of the urea group be 15% or more by mass, because the cohesive force of the resin can be enhanced so that excellent gas barrier property can be expressed.

Meanwhile, the concentration of the urethane group or the concentration of the urea group is the value obtained by dividing the molecular weight of the urethane group (59 g/equivalent) or the molecular weight of the urea group (58 g/equivalent) with the molecular weight of the repeating composition unit structure.

(Structure)

The repeating composition unit of the polyurethane-based resin includes preferably the unit of an aromatic or a non-aromatic hydrocarbon ring, for example, the composition unit of an aromatic or an alicyclic compound, wherein these aromatic or alicyclic compounds are usually derived from the diisocyanate component; however, these may be derived from the diol component as well. The ratio of the hydrocarbon ring unit in the repeating unit of the polyurethane-based resin is preferably in the range of 10 to 70% by mass, more preferably in the range of 15 to 65% by mass, while still more preferably in the range of about 20 to about 60% by mass.

The polyurethane-based resin contains a repeating unit composed of the diisocyanate component (especially an aromatic diisocyanate or the like) and the diol component (especially, a $C_{2-8}$ alkylene glycol or the like), wherein it is suitable when the content of the repeating unit in the entire composition units is 30% or more by mole, preferably 50% or more by mole, while more preferably 70% or more by mole. Meanwhile, in this case, too, if the aromatic diol (or diamine) such as xylylene diol (or diamine) is used as the diol component (or the diol and diamine component) and the low-molecular weight diisocyanate such as HDI is used as the diisocyanate component, the same effects can be obtained.

Terminal of the polyurethane-based resin may be any of a hydroxy group and an isocyanate group. The one with the hydroxy group is suitable as a thermoplastic molding material, while in the case of the isocyanate group, not only the adhesiveness can be enhanced at the time of coating to the plastic substrate, but also a post hardening due to humidity can be expected.

(Number-average Molecular Weight)

The number-average molecular weight of the polyurethane-based resin may be selected preferably from the range of 1,000,000 to 5,000,000, more preferably from the range of 1,000,000 to 3,000,000, while still more preferably from the range of about 1,000,000 to about 2,000,000. The molecular weight of 1,000,000 or more is preferable because a sufficient strength can be obtained when it is used as a formed article such as a film. In addition, when it is coated onto the silicon oxide film, the polyurethane-based resin itself is given the cohesive force so that film formation thereof becomes easy. On the other hand, the molecular weight of 5,000,000 or less is preferable, because the resin viscosity of the polyurethane can be made low even in the solvent, resulting in good workability in operation of coating and lamination.

(Crystallinity)

The polyurethane-based resin having high crystallinity is excellent in the gas barrier property. Also, the glass transition point of the polyurethane-based resin is preferably 90° C. or higher (for example, in the range of about 90 to about 200° C.), more preferably 110° C. or higher (for example, in the range of about 110 to about 180° C.), while still more preferably 115° C. or higher (for example, in the range of about 115 to about 150° C.). The glass transition point of 90° C. or higher is preferable because the gas barrier property can be enhanced.

Silane Coupling Agent (c2)

The silane coupling agent of the present invention can be exemplified by hydrolysable alkoxy silane compounds, wherein illustrative example thereof includes: halogen-containing alkoxy silanes such as chloro $C_{2-4}$ alkyl tri-$C_{1-4}$ alkoxy silanes including 2-chloroethyl trimethoxy silane, 2-chloroethyl triethoxy silane, 3-chloropropyl trimethoxy silane, and 3-chloropropyl triethoxy silane; epoxy group-containing alkoxy silanes such as glycidyloxy $C_{2-4}$ alkyl tri-$C_{1-4}$ alkoxysilanes including 2-glycidyloxyethyl trimethoxy silane, 2-glycidyloxyethyl triethoxy silane, 3-glycidyloxypropyl trimethoxy silane, and 3-glycidyloxypropyl triethoxy silane, glycidyloxy di-$C_{2-4}$ alkyl di-$C_{1-4}$ alkoxysilanes including 3-glycidyloxypropyl methyl dimethoxy silane and 3-glycidyloxypropyl methyl diethoxy silane, and (epoxycycloalkyl) $C_{2-4}$ alkyl tri-$C_{1-4}$ alkoxysilanes including 2-(3,4-epoxycyclohexyl)ethyl trimethoxy silane, 2-(3,4-epoxycyclohexyl)ethyl triethoxy silane, and 3-(3,4-epoxycyclohexyl)propyl trimethoxy silane; amino group-containing alkoxy silanes such as amino $C_{2-4}$ alkyl tri-$C_{1-4}$ alkoxysilanes including 2-aminoethyl trimethoxy silane, 3-aminopropyl trimethoxy silane, and 3-aminopropyl triethoxy silane, amino di-$C_{2-4}$ alkyl di-$C_{1-4}$ alkoxy silanes including 3-aminopropyl methyl dimethoxy silane and 3-aminopropyl methyl diethoxy silane, (2-amino $C_{2-4}$ alkyl) amino $C_{2-4}$ alkyl tri-$C_{1-4}$ alkoxy silanes including 2-[N-(2-aminoethyl)amino]ethyl trimethoxy silane, 3-[N-(2-aminoethyl)amino]propyl trimethoxy silane, and 3-[N-(2-aminoethyl)amino]propyl triethoxy silane, (amino $C_{2-4}$ alkyl) amino di-$C_{2-4}$ alkyl di-$C_{1-4}$ alkoxy silanes including 3-[N-(2-aminoethyl)amino]propyl methyl dimethoxy silane and 3-[N-(2-aminoethyl)amino]propyl methyl diethoxy silane; mercapto group-containing alkoxy silanes such as mercapto $C_{2-4}$ alkyl tri-$C_{1-4}$ alkoxysilanes including 2-mercaptoethyl trimethoxy silane, 3-mercaptopropyl trimethoxy silane, and 3-mercaptopropyl triethoxy silane, mercapto di-$C_{2-4}$ alkyl di-$C_{1-4}$ alkoxysilanes including 3-mercaptopropyl methyl dimethoxy silane and 3-mercaptopropyl methyl diethoxy silane; vinyl group-containing alkoxy silanes such as vinyl tri-$C_{1-4}$ alkoxysilanes including vinyl trimethoxy silane and vinyl triethoxy silane; ethylenic unsaturated bond-containing alkoxy silanes such as (meth)acryloxy $C_{2-4}$ alkyl tri-$C_{1-4}$ alkoxysilanes including 2-(meth)acryloxyethyl trimethoxy silane, 2-(meth)acryloxyethyl triethoxy silane, 3-(meth)acryloxypropyl trimethoxy silane, and 3-(meth)acryloxypropyl triethoxy silane, (meth)acryloxy di-$C_{2-4}$ alkyl di-$C_{1-4}$ alkoxy silanes including 3-(meth)acryloxypropyl methyl dimethoxy silane and 3-(meth)acryloxypropyl methyl diethoxy silane. These silane coupling agents may be used singly or as a combination of two or more of them.

The present invention has a coat layer (this is sometimes referred to as a top coat layer or a resin layer) which is formed by applying a coating solution which is a mixture of the polyurethane-based resin (c1) and the silane coupling agent (c2), wherein in the coating solution the mixing ratio of polyurethane-based resin (c1)/silane coupling agent (c2) =99/1 to 80/20 by mass ratio is preferable because the gas barrier laminate film shows high gas barrier property from the time immediately after the production thereof, and also the gas barrier laminate film excellent in the gas barrier property and high in the adhesion strength after a retort treatment can be provided. The mass ratio of the (c1) component to the (c2) component is more preferably in the range of 99/1 to 85/15, while more preferably in the range of about 99/1 to about 90/10.

In the coating solution, the polyurethane-based resin (c1) and the silane coupling agent (c2) are caused to react with each other, so that a reaction product is formed therein.

The gas barrier laminate film of the first embodiment requires that the number-average molecular weight of the reaction product of the polyurethane-based resin (c1) and the silane coupling agent (c2) be in the range of 100,000 to 1,000,000. When the number-average molecular weight of the reaction product falls within the foregoing range, the barrier property can be enhanced though the reason for it is unclear. The number-average molecular weight thereof is preferably in the range of 100,000 to 500,000, more preferably in the range of 100,000 to 400,000, while still more preferably in the range of 150,000 to 350,000. Meanwhile, the number-average molecular weight thereof is the value obtained by the method described in Examples.

In the gas barrier laminate film of the second embodiment, the number average molecular weight of the reaction product of the polyurethane-based resin (c1) and the silane coupling agent (c2) is preferably in the range of 100,000 to 1,000,000, more preferably in the range of 100,000 to 400,000, while still more preferably in the range of 150,000 to 350,000. Meanwhile, the number-average molecular weight thereof is the value obtained by the method described in Examples.

Into the coating solution of the present invention, various heretofore known additives may be blended if necessary. Illustrative example of the additive includes: polyvalent alcohols such as glycerin, ethylene glycol, polyethylene glycol, and polypropylene glycol; aqueous epoxy resin; lower alcohols such as methanol, ethanol, normal propanol, and isopropanol; ethers such as ethylene glycol monomethyl ether, propylene glycol monomethyl ether, propylene glycol diethyl ether, diethylene glycol monoethyl ether, and propylene glycol monoethyl ether; esters such as propylene glycol monoacetate and ethylene glycol monoacetate; as well as antioxidant, a weathering stabilizer, a UV absorber, an antistatic agent, a pigment, a dye, an antibacterial agent, a lubricant, an inorganic filler, an anti-blocking agent, an adhesive agent, and the like.

The coating solution of the present invention is preferably an aqueous dispersion solution.

Further, the coating solution of the present invention may be used as a mixture with an aqueous dispersion solution of other resin. Illustrative example of the other resin for such aqueous dispersion solution includes polyvinyl acetate, ethylene-vinyl acetate copolymer, polyvinyl chloride, polyvinylidene chloride, water-soluble acryl resin, acrylamide resin, methacrylamide resin, acrylonitrile resin, styrene-acrylic acid copolymer, water-soluble styrene-maleic acid copolymer, styrene-butadiene copolymer, high-impact polystyrene resin, butadiene resin, polyester resin, acrylonitrile-butadiene copolymer, polyethylene resin, polyethylene oxide resin, propylene-ethylene copolymer, maleic anhydride-grafted propylene-ethylene copolymer, chlorinated polyethylene, chlorinated polypropylene, EPDM, phenolic resin, silicone resin, and epoxy-based resin. These may be used singly or as a combination of two or more of them as an aqueous dispersion solution.

Preparation method of the coating solution of the present invention is not particularly restricted. For example, the coating solution may be prepared by a method in which a silane coupling agent or an aqueous solution thereof is added to an aqueous dispersion solution formed by dispersing or dissolving each resin into water, or by a method in which an aqueous dispersion solution of each resin is mixed with a silane coupling agent or an aqueous solution thereof. In these methods, the coating solution may be prepared by using a solvent other than water, such as, for example, an alcohol.

Application of the coating solution of the present invention to surface of the silicon oxide layer may be made by appropriately selecting a method from heretofore known coating methods. For example, any of methods using, such as a reverse roll coater, a gravure coater, a rod coater, an air doctor coater, and a coating method using a spray or the like may be used. The coating may also be made by dipping the silicon oxide layer having been formed on the plastic substrate into the coating solution of the present invention. After the application, water and so forth can be evaporated by using a heretofore known drying method such as drying by heating, for example, with hot-air drying at a temperature of about 80 to about 200° C. or with heat roll drying, or by infrared drying. By so doing, a gas barrier laminate film having a uniform coat layer can be obtained.

In the gas barrier laminate film of the present invention, the thickness of the coat layer is not particularly restricted. The thickness is usually in the range of 0.1 to 20 μm; however, in view of the gas barrier property, the cost, and the like, the thickness is preferably in the range of 0.1 to 10 μm. In order to enhance the water resistance and the durability, a crosslinking treatment may also be applied to this coat layer by irradiation of an electron beam.

The tensile strength of the coat layer is preferably in the range of 20 to 100 MPa because in this range an excellent gas barrier property can be obtained. The tensile strength is more preferably in the range of 30 to 70 MPa, while still more preferably in the range of 30 to 50 MPa.

In addition, when the elongation of the coat layer is in the range of 1 to 10%, an excellent gas barrier property can be obtained. The elongation is preferably in the range of 1 to 7%, while more preferably in the range of 1 to 3%.

In the gas barrier laminate film of the present invention, the water vapor permeability measured by the method described in Example is preferably 5 $g/m^2/24$-hours or less, more preferably 2 $g/m^2/24$-hours or less, still more preferably 0.5 $g/m^2/24$-hours or less, while especially preferably 0.3 $g/m^2/24$-hours or less.

As the gas barrier laminate film of the present invention, a configuration that an additional composition layer is further laminated, if necessary, to the foregoing composition layers may also be allowed. For example, a gas barrier laminae film having a plastic film laminated on the coat surface of the coat layer and/or on the surface of the plastic substrate may be used in various uses. In view of the mechanical strength, flexibility, transparency, and the like as the laminate film or as the substrate for the laminate body, the thickness thereof may be selected usually from the range of 5 to 500 μm, while preferably from the range of 10 to 200 μm in accordance with the use thereof. Also, there is no particular restriction with regard to the width and length of the plastic film, so that these are appropriately selected in accordance with the use thereof. For example, by laminating a resin layer comprising a heat-sealable resin on the coat surface of the coat layer and/or on the surface of the plastic substrate, the film becomes heat-sealable; and thus, this can be used as various container materials. Illustrative example of the heat-sealable resin includes heretofore known resins such as a polyethylene-based resin, a polypropylene-based resin, ethylene-vinyl acetate copolymer, an ionomer resin, an acryl-based resin, and a biodegradable resin.

In addition, according to an embodiment of the gas barrier laminate film other than the above mentioned, a laminate body in which a printing layer is formed on the surface of the coat layer, and a heat-seal layer or a plastic film is further laminated thereon may be mentioned. As a printing ink for forming the printing layer, a printing ink containing a water-based or a solvent-based resin can be used. Here, illustrative example of the a resin used for the printing ink includes an acryl-based resin, a polyurethane-based resin, a polyester-based resin, a vinyl chloride-based resin, a vinyl acetate copolymer resin, or a mixture of them. Further, to the printing ink, heretofore known additives such as an antistatic agent, a light blocking agent, a UV-absorber, a plasticizer, a lubricant, a filler, a colorant, a stabilizer, a lubricating agent, a defoaming agent, a cross-linking agent, an anti-blocking agent, and an antioxidant may be added.

There is no particular restriction with regard to the printing method for preparing the printing layer; and heretofore known printing methods such as an offset printing method, a gravure printing method, and a screen printing method may be used. For drying the solvent after printing, heretofore known drying methods such as a hot-air blow drying method, a hot roll drying method, and an infrared drying method may be used. Further, between the printing layer and the heat-seal layer or the plastic film, at least one layer of paper or a plastic film may be laminated. With regard to the plastic film, a film similar to the thermoplastic resin film used as the plastic substrate in the gas barrier laminate film of the present invention may be used. In particular, in view of obtaining sufficient rigidity and strength of the laminate body, a paper, a polyester-based resin, a polyamide-based resin, or a biodegradable resin is preferable.

In the case that a polyester film is used as the plastic substrate, a specific embodiment of the composition of the laminate body includes a laminate body wherein a heat-seal layer is laminated on the coat layer side of the gas barrier laminate film, as well as an embodiment wherein a printing layer, a polyamide film, or the like is formed therebetween. In this case, if the hot water shrinkage rate of the polyamide film at 127° C. is not more than 15%, the stress due to the size change at the time of the hot-water treatment of the laminate body can be suppressed, resulting in good gas barrier property after the hot-water treatment.

Further, in the case that a polyamide film or a polyvinyl alcohol film is used for the plastic substrate, for example, a laminate body wherein a printing layer or a polyester film is laminated on the coat layer side of the gas barrier laminate film and a heat-seal layer is laminated on the surface of the plastic substrate side may be mentioned.

Further, mentioned as a specific embodiment of the laminate body of the present invention are: (A) in the case that a biaxially stretched polyester film is used for the plastic substrate, (A-1) a laminate body wherein an unstretched polypropylene film having the thickness of 30 to 200 μm is laminated on the surface of the coat layer of the gas barrier laminate film, or (A-2) a laminate body wherein a biaxially stretched nylon 6 film having the thickness of 5 to 100 μm and an unstretched polypropylene film having the thickness of 30 to 200 μm are sequentially laminated on the surface of the coat layer of the gas barrier laminate film, or (B) in the case that a biaxially stretched polyamide film is used for the plastic substrate, a laminate body wherein a biaxially stretched polyester film having the thickness of 5 to 100 μm is laminated on the surface of the coat layer of the gas barrier laminate film, and also an unstretched polypropylene film having the thickness of 30 to 200 μm is laminated on the surface of the plastic substrate of the laminate film, wherein each of these laminate bodies after the hot-water treatment at 125° C. for 30 minutes has the oxygen permeability of preferably 25 mL/m$^2$/24-hours/MPa or less, more preferably 20 mL/m$^2$/24-hours/MPa or less, still more preferably 10 mL/m$^2$/24-hours/MPa or less, while especially preferably 4 mL/m$^2$/24-hours/MPa or less. In addition, the water vapor permeability thereof is preferably 5 g/m$^2$/24-hours or less, more preferably 2 g/m$^2$/24-hours or less, still more preferably 0.5 g/m$^2$/24-hours or less, while especially preferably 0.3 g/m$^2$/24-hours or less.

In the present invention, after the silicon oxide layer is formed, or after the coat layer is formed, or after the printing layer and the plastic film and/or the paper are further laminated on the plastic substrate, it is preferable to carry out a heat treatment in view of the gas barrier property, the film quality of the silicon oxide layer, stabilizing of the coat layer quality, and the like. The heat treatment may be carried out in two or more arbitrary stages in any of the foregoing stages. Conditions of the heat treatment are different depending on types, thicknesses, and the like of components to constitute the gas barrier laminate film or the laminate body; however, the heat treatment method is not particularly restricted so far as a required temperature and time can be maintained with the method. For example, there may be employed: a method involving storing the film in an oven or a thermostat chamber whose temperature is set at a required temperature; a method involving blowing a hot air; a method involving heating with an infrared heater; a method involving irradiation of a light using a lamp; a method involving directly providing a heat by bringing the film into contact with a hot roll or a hot plate; or a method involving irradiation of a microwave. Further, the film may be subjected to the heat treatment after having been cut to a dimension at which the handling thereof is made easy, or a film roll thereof may be subjected to the heat treatment as it is. In addition, so far as a required time and temperature can be obtained, heating can be carried out during a production process by installing a heating device in a part of a film production apparatus such as a coater or a slitter.

The temperature of the heat treatment is not particularly restricted so far as the temperature is not higher than each melting point of the substrate, the plastic film, and the like, which are to be used; however, the temperature is preferably 60° C. or higher, while more preferably 70° C. or higher, because the heat treatment time required for exhibiting the effects of the heat treatment can be suitably determined. The upper limit of the temperature of the heat treatment is usually 200° C., while preferably 160° C., in view of preventing deterioration in the gas barrier property due to thermal decomposition of components to constitute the gas barrier laminate film or the laminate body. The treatment time depends on the temperature of the heat treatment. As the treatment temperature is higher, the heat treatment time is preferably shorter. For example, when the temperature of the heat treatment is 60° C., the treatment time is about 3 days to about 6 months; when the temperature of the heat treatment is 80° C., the treatment time is about 3 hours to about 10 days; when the temperature of the heat treatment is 120° C., the treatment time is about 1 hour to 1 day; and when the temperature of the heat treatment is 150° C., the treatment time is about 3 minutes to about 60 minutes. The above-mentioned temperatures of the heat treatment and the heat treatment times are merely guides, and the temperatures of the heat treatment and the heat treatment time can be arbitrarily adjusted depending on types, thicknesses, and the like of the components to constitute the gas barrier laminate film or the laminate body.

As described above, the gas barrier laminate film of the present invention can be obtained by forming the silicon oxide layer (B) by a vapor deposition method or the like on at least one surface of the plastic substrate (A), followed by forming the coat layer by applying the coating solution on the surface of the silicon oxide layer (B), wherein the coating solution is obtained by mixing a polyurethane-based resin (c1) and a silane coupling agent (c2), and further followed by laminating other layer, if necessary.

EXAMPLES

Hereunder, the present invention will be explained specifically by way of Examples; however, the present invention is not limited to the following examples. Meanwhile, the evaluation methods of the film and so forth in Examples are as follows.

<Number-average Molecular Weight, Weight-Average Molecular Weight, and Polydispersity>

An aqueous dispersion solution of a polyurethane-based resin (c1) was freeze-dried. The freeze-dried product thereby obtained was dissolved into an eluent, dimethylformamide (DMF), and the solution thus prepared was allowed to stand for one overnight. This solution was filtrated through a 0.45 μm membrane filter; and then, the filtrate thereof was subjected to the GPC measurement (polystyrene equivalent) to obtain the number-average molecular weight (Mn), the weight-average molecular weight (Mw), and the polydispersity (Mw/Mn) of the polyurethane-based resin (c1).

An aqueous dispersion solution of a polyurethane-based resin (c1) was mixed with a silane coupling agent (c2) in accordance with the mass ratio described in Table 1 and Table 2 to obtain a coating solution; and then, DMF as an eluent was added to the coating solution. After the solution thus prepared was allowed to stand for one overnight, this solution was filtrated through a 0.45 μm membrane filter; and then, the filtrate thereof was subjected to the GPC measurement (polystyrene equivalent) to obtain the number-average molecular weight (Mn), the weight-average molecular weight (Mw), and the polydispersity (Mw/Mn) of the reaction product between the polyurethane-based resin (c1) and the silane coupling agent (c2).

(Analytical Instrument)
TOSOH HLC-8120 GPC (Measurement Conditions)
Column: TSK gel, super AWM-H+super AW 4000+super AW2500
Column size: each has 6.0 mm I.D.×150 mm
Eluent: 30 mM LiBr+10 mM phosphoric acid in DMF
Flow rate: 0.4 mL/minute
Detector: RI
Column temperature: 40° C.
Injection volume: 20 μL <Oxygen Permeability>

With regard to the gas barrier laminate film, by using an oxygen permeability measurement instrument ("OX-TRAN 100-Type Oxygen Permeability Measurement Instrument", manufactured by Modern Controls, Inc.), the oxygen permeability (mL/m$^2$/24-hours/MPa) under the conditions of the temperature at 25° C. and the humidity of 80% R. H. was measured.

<Water Vapor Permeability>

In conformity with the conditions stipulated in JIS Z0222 "Test Method for Humidity Permeability of Moisture-Proof Container" and JIS Z0208 "Test Method for Humidity Permeability of Moisture-Proof Packaging Material (Cup Method)", the water vapor permeability was evaluated in the way as described below.

A urethane-based adhesive (10:1.5 blend of "AD900" and "CAT-RT85" (both manufactured by Toyo-Morton, Ltd.)) was applied onto the surface of the silicon oxide layer side (in Comparative Example 4, the top coat layer side) of the gas barrier laminate film having the humidity permeation area of 10.0 cm×10.0 cm square, and then, it was dried to obtain an adhesive layer having the thickness of about 3 μm. Then, an unstretched polypropylene film having the thickness of 60 μm ("Pylen Film CT P1146", manufactured by Toyobo Co., Ltd.) was laminated on this adhesive layer to obtain a laminate body.

By using two sheets of the laminates thus obtained, a bag into which about 20 g of anhydrous calcium chloride was put as a moisture adsorbent was prepared by sealing four sides thereof. The bag was put in a constant temperature and humidity chamber controlled at a temperature of 40° C. and a relative humidity of 90% until the passage of 14 days, which is rough indication when an increase in the mass is considered to be almost constant within this period, with measuring the mass (precision of 0.1 mg) in the time interval of 48 hours or more. The water vapor permeability was calculated from the slope of the regression line between the mass of the bag and the passage time on and after the third day; and this was taken as the water vapor permeability of the gas barrier laminate film.

<Laminate Strength>

A plastic film was laminated via an adhesive layer on the surface opposite to the plastic substrate side of the gas barrier laminate film to obtain a laminate body. A strip film obtained from the laminate body, having a size of 15 mm width and 100 mm length, wherein during the time of preparation of the laminate body (namely, during the time of laminating each layer), a releasing paper as a spacer was intervened in the ½ portion in the longitudinal direction thereof (namely, the portion of the width of 15 mm and the length of 50 mm) so as to form the area without the adhesive layer present, was used as a specimen film. Then, the T-type peel test was carried out from the area without the adhesive layer, wherein the peeling was made from the side of the gas barrier laminate film and from the side of the plastic film. Namely, the laminate strength (g/15 -mm) was measured by T-type peeling at the rate of 100 mm/minute under an environment of 23° C. and 50% R. H. in conformity with JIS Z1707 by using a peeling test instrument (product name of EZ-TEST, manufactured by Shimadzu Corp.). Meanwhile, the adhesive layer (thickness of about 3 μm) was formed by applying a urethane-based adhesive (10:1.5 blend of "AD900" and "CAT-RT85" (both manufactured by Toyo-Morton, Ltd.)) followed by drying thereof. Also, as the plastic film, an unstretched polypropylene film having the thickness of 60 μm ("Pylen Film CT P1146", manufactured by Toyobo Co., Ltd.) was used.

<Water Resistant Laminate Strength>

A plastic film was laminated via an adhesive layer on the surface opposite to the plastic substrate side of the gas barrier laminate film to obtain a laminate body. A strip film obtained from the laminate body, having a size of 15 mm width and 100 mm length, wherein during the time of preparation of the laminate body (namely, during the time of laminating each layer), a releasing paper as a spacer was intervened in the ½ portion in the longitudinal direction thereof (namely, the portion of the width of 15 mm and the length of 50 mm) so as to form the area without the adhesive layer present, was used as a specimen film. Then, the T-type peel test was carried out from the area without the adhesive layer, wherein the peeling was made from the side of the gas barrier laminate film and from the side of the plastic film. Namely, the laminate strength (g/15-mm) was measured by T-type peeling at the rate of 100 mm/minute under an environment of 23° C. and 50% R. H. in conformity with JIS Z1707 by using a peeling test instrument (product name of EZ-TEST, manufactured by Shimadzu Corp.) with attaching water on the releasing surface. Meanwhile, the adhesive layer (thickness of about 3 μm) was formed by applying a urethane-based adhesive (10:1.5 blend of "AD900" and "CAT-RT85" (both manufactured by Toyo-Morton, Ltd.)) followed by drying thereof. Also, as the plastic film, an unstretched polypropylene film having the thickness of 60 μm ("Pylen Film CT P1146", manufactured by Toyobo Co., Ltd.) was used.

<Aqueous Dispersion Solution of the Polyurethane-based Resin (c1)>

The aqueous dispersion solution of the polyurethane-based resin (c1-1) was produced in the way as described below.

A mixture of 439.1 g of hydrogenated XDI (1,4-bis (isocyanatemethyl)cyclohexane), 35.4 g of dimethylolpropionic acid, 61.5 g of ethylene glycol, and 140 g of acetonitrile as a solvent was caused to react in a nitrogen atmosphere at 70° C. for 3 hours to obtain a carboxyl group-containing polyurethane prepolymer solution. Next, this carboxyl group-containing polyurethane prepolymer solution was neutralized by 24.0 g of triethylamine at 50° C. Then, 267.9 g of this polyurethane prepolymer solution was dispersed into 750 g of water by using a homodisper to cause the chain elongation reaction with 35.7 g of 2-[(2-aminoethyl)amino]ethanol; and then, acetonitrile was distilled out to obtain the aqueous dispersion solution of the polyurethane-based resin (c1-1) with the solid concentration of 25% by mass. In this polyurethane-based resin (c1-1), the sum of the concentration of the urethane group and the concentration of the urea group was 41.1% by mass, the number-average molecular weight (Mn) was 1,600,000, the weight-average molecular weight (Mw) was 2,240,000, and polydispersity (Mw/Mn) was 1.4.

Similarly, the aqueous dispersion solution of the polyurethane-based resin (c1-2) was produced in the way as described below.

A mixture of 45.5 g of XDI (xylylene diisocyanate), 93.9 g of hydrogenated XDI (1,3-bis(isocyanatemethyl)cyclohexane), 24.8 g of ethylene glycol, 13.4 g of dimethylolpropionic acid, and 80.2 g of methyl ethyl ketone as a solvent was caused to react in a nitrogen atmosphere at 70° C. for 5 hours to obtain a carboxyl group-containing polyurethane prepolymer solution. Next, this carboxyl group-containing polyurethane prepolymer solution was neutralized by 9.6 g of triethylamine at 40° C. Then, this polyurethane prepolymer solution was dispersed into 624.8 g of water by using a homodisper to cause the chain elongation reaction with 21.1 g of 2-[(2-aminoethyl)amino] ethanol; and then, methyl ethyl ketone was distilled out to obtain the aqueous dispersion solution of the polyurethane-based resin (c1-2) with the solid concentration of 25% by mass. In this polyurethane-based resin (c1-2), the sum of the concentration of the urethane group and the concentration of the urea group was 39.6% by mass, the number-average molecular weight (Mn) was 200,000, the weight-average molecular weight (Mw) was 450,000, and polydispersity (Mw/Mn) was 2.3.

Similarly, the aqueous dispersion solution of the polyurethane-based resin (c1-3) was produced in the way as described below.

A mixture of 125.3 g of H12MDI (dicyclohexylmethane diisocyanate), 46.4 g of hydrogenated XDI, 22.1 g of ethylene glycol, 20.8 g of dimethylolpropionic acid, and 123.1 g of acetonitrile as a solvent was caused to react in a nitrogen atmosphere at 70° C. for 6 hours to obtain a carboxyl group-containing polyurethane prepolymer solution. Next, this carboxyl group-containing polyurethane prepolymer solution was neutralized by 14.1 g of triethylamine at 40° C. Then, this polyurethane prepolymer solution was dispersed into 750.0 g of water by using a homodisper to cause the chain elongation reaction with 21.3 g of 2-[(2-aminoethyl)amino]ethanol; and then, acetonitrile was distilled out to obtain the aqueous dispersion solution of the polyurethane-based resin (c1-3) with the solid concentration of 25% by mass. In this polyurethane-based resin (c1-3), the sum of the concentration of the urethane group and the concentration of the urea group was 33.6% by mass, the number-average molecular weight (Mn) was 400,000, the weight-average molecular weight (Mw) was 550,000, and polydispersity (Mw/Mn) was 1.4.

<Silane Coupling Agent (c2)>

With regard to the silane coupling agent (c2) to constitute the coating solution, commercially available 3-glycidyloxypropyl trimethoxy silane was used.

Examples 1 to 4

Polyethylene terephthalate resin (hereunder, this is abbreviated as PET) ("Novapex", manufactured by Mitsubishi Chemical Corp.) was melt-extruded to form a sheet, which was then stretched to a longitudinal direction with a stretching ratio of 3.3 at the stretching temperature of 95° C., and then, to a lateral direction with a stretching ratio of 3.3 at the stretching temperature of 110° C. to obtain the biaxially stretched PET film having the thickness of 12 m. On one surface of the film was applied a mixture of an isocyanate compound ("Coronate L", manufactured by Nippon Polyurethane Industry Co., Ltd.) and a saturated polyester ("Biron 300", manufactured by Toyobo Co., Ltd.) with the mass ratio of 1:1; and then, it was dried to obtain an anchor coat layer having the thickness of 0.1 μm.

Next, by using a vacuum vapor deposition apparatus, SiO was evaporated by a heating method under the vacuum of $1 \times 10^{-5}$ Torr, thereby forming an inorganic layer of silicon oxide having the thickness of about 20 nm on the anchor coat layer.

Thereafter, the aqueous dispersion solution of the polyurethane-based resin (c1-1) was mixed with the silane coupling agent (c2) such that the mass ratio of the polyurethane-based resin (c1-1) to the silane coupling agent (c2) as well as the thickness of the coat layer after drying might become the values as described in Table 1; and then, after the coating solution thus prepared was applied onto the surface of the inorganic layer by using a bar coater, this was dried by blowing an air at 80° C. for 2 minutes to obtained the gas barrier laminate film. Meanwhile, the transparency thereof was as same as that of the laminate film not coated with the coating solution.

The above-mentioned evaluations were carried out with regard to the gas barrier laminate film thus obtained.

Similarly, the above-mentioned evaluations were also carried out with regard to the gas barrier laminate film after a pressurized hot water treatment; this gas barrier laminate film having been obtained by subjecting the gas barrier laminate film to the hot water treatment in an autoclave at 125° C. for 30 minutes followed by air-drying of the water attached to around the laminate body.

These results are collectively shown in Table 1.

Comparative Example 1

Example 1 was repeated, except that the top coat layer was not formed, to obtain the gas barrier laminate film.

The above-mentioned evaluations were carried out with regard to the gas barrier laminate film thus obtained.

Similarly, the above-mentioned evaluations were also carried out with regard to the gas barrier laminate film after a pressurized hot water treatment; this gas barrier laminate film having been obtained by subjecting the gas barrier laminate film to the hot water treatment in an autoclave at 125° C. for 30 minutes followed by air-drying of the water attached to around the laminate body.

These results are collectively shown in Table 2.

Comparative Example 2

The inorganic layer was formed in the same way as Example 1; and thereafter, the coating solution comprising the aqueous dispersion of the polyurethane-based resin (c1-2) prepared such that the thickness after drying might become the thickness shown in Table 2 was applied onto the inorganic layer by a bar coater; and then, this was dried by blowing an air at 80° C. for 2 minutes to obtained the gas barrier laminate film. Meanwhile, the transparency thereof was as same as that of the laminate film not coated with the coating solution.

The above-mentioned evaluations were carried out with regard to the gas barrier laminate film thus obtained.

Similarly, the above-mentioned evaluations were also carried out with regard to the gas barrier laminate film after a pressurized hot water treatment; this gas barrier laminate film having been obtained by subjecting the gas barrier laminate film to the hot water treatment in an autoclave at 125° C. for 30 minutes followed by air-drying of the water attached to around the laminate body.

These results are collectively shown in Table 2.

Comparative Example 3

In the formation of the inorganic layer in Example 1, instead of vapor deposition of silicon oxide (silica), aluminum was evaporated to carry out the vapor deposition at $1\times10^{-4}$ Torr with supplying an oxygen gas by using a gas flow rate controlling apparatus to form an inorganic layer of aluminum oxide (alumina) having the thickness of about 20 nm. Thereafter, the aqueous dispersion solution of the polyurethane-based resin (c1-2) was mixed with the silane coupling agent (c2) such that the mass ratio of the polyurethane-based resin (c1-2) to the silane coupling agent (c2) as well as the thickness of the coat layer after drying might become the values as described in Table 2; and then, after the coating solution thus prepared was applied onto the surface of the inorganic layer by using a bar coater, this was dried by blowing an air at 80° C. for 2 minutes to obtained the gas barrier laminate film. Meanwhile, the transparency thereof was as same as that of the laminate film not coated with the coating solution.

The above-mentioned evaluations were carried out with regard to the gas barrier laminate film thus obtained.

Similarly, the above-mentioned evaluations were also carried out with regard to the gas barrier laminate film after a pressurized hot water treatment; this gas barrier laminate film having been obtained by subjecting the gas barrier laminate film to the hot water treatment in an autoclave at 125° C. for 30 minutes followed by air-drying of the water attached to around the laminate body.

These results are collectively shown in Table 2.

Comparative Example 4

In the formation of the inorganic layer in Example 1, a top coat layer was formed without forming the inorganic layer after formation of the anchor coat layer. Then, the aqueous dispersion solution of the polyurethane-based resin (c1-3) was mixed with the silane coupling agent (c2) such that the mass ratio of the polyurethane-based resin (c1-3) to the silane coupling agent (c2) as well as the thickness of the top coat layer after drying might become the values as described in Table 2; and then, after the coating solution thus prepared was applied onto the surface of the anchor coat layer by using a bar coater, this was dried by blowing an air at 80° C. for 2 minutes to obtained the gas barrier laminate film. Meanwhile, the transparency thereof was as same as that of the laminate film not coated with the coating solution.

The above-mentioned evaluations were carried out with regard to the gas barrier laminate film thus obtained.

Similarly, the above-mentioned evaluations were also carried out with regard to the gas barrier laminate film after a pressurized hot water treatment; this gas barrier laminate film having been obtained by subjecting the gas barrier laminate film to the hot water treatment in an autoclave at 125° C. for 30 minutes followed by air-drying of the water attached to around the laminate body.

These results are collectively shown in Table 2.

Comparative Example 5

The inorganic layer was formed in the same way as Example 1. Thereafter, the aqueous dispersion solution of the polyurethane-based resin (c1-3) was mixed with the silane coupling agent (c2) such that the mass ratio of the polyurethane-based resin (c1-3) to the silane coupling agent (c2) as well as the thickness of the coat layer after drying might become the values as described in Table 2; and then, after the coating solution thus prepared was applied onto the surface of the inorganic layer by using a bar coater, this was dried by blowing an air at 80° C. for 2 minutes to obtained the gas barrier laminate film. Meanwhile, the transparency thereof was as same as that of the laminate film not coated with the coating solution.

The above-mentioned evaluations were carried out with regard to the gas barrier laminate film thus obtained.

Similarly, the above-mentioned evaluations were also carried out with regard to the gas barrier laminate film after a pressurized hot water treatment; this gas barrier laminate film having been obtained by subjecting the gas barrier laminate film to the hot water treatment in an autoclave at 125° C. for 30 minutes followed by air-drying of the water attached to around the laminate body.

These results are collectively shown in Table 2.

TABLE 1

| | | | Example 1 | Example 2 | Example 3 | Example 4 |
|---|---|---|---|---|---|---|
| Layer compo-sition | Film substrate | | PET | PET | PET | PET |
| | Inorganic layer | | Silicon oxide | Silicon oxide | Silicon oxide | Silicon oxide |
| | Coat layer | Film thickness (μm) | 0.5 | 0.5 | 1.0 | 0.5 |
| | | PU vs SC mass ratio PU/SC | 99/1 | 96/4 | 96/4 | 92/8 |
| | | Reaction product of PU and SC Number-average molecular weight (Mn) | 350,000 | 190,000 | 190,000 | 150,000 |
| | | Reaction product of PU and SC Weight-average molecular weight (Mw) | 1,890,000 | 1,520,000 | 1,520,000 | 1,280,000 |
| | | Reaction product of PU and SC Polydispersity (Mw/Mn) | 5.4 | 8.0 | 8.0 | 8.5 |
| Barrier property | Before pressurised hot water treatment | Oxygen permeability (mL/m$^2$/24 hr/MPa) | 1.8 | 1.8 | 1.4 | 1.3 |
| | | Water vapor permeability (g/m$^2$/24 hr) | 0.2 | 0.2 | 0.1 | 0.2 |
| | | Laminate strength (g/15-mm width) | 980 | 860 | 840 | 570 |

TABLE 1-continued

|  |  |  | Example 1 | Example 2 | Example 3 | Example 4 |
|---|---|---|---|---|---|---|
|  |  | Water resistant laminate strength (g/15-mm width) | 330 | 350 | 930 | 980 |
| After pressurised hot water treatment | | Oxygen permeability (mL/m$^2$/24 hr/MPa) | 1.9 | 2.0 | 2.3 | 2.9 |
|  |  | Water vapor permeability (g/m$^2$/24 hr) | 0.5 | 0.6 | 0.6 | 0.7 |
|  |  | Water resistant laminate strength (g/15-mm width) | 710 | 630 | 780 | 630 |

*PU: polyurethane-based resin, SC: silane coupling agent

TABLE 2

|  |  |  | Comparative Example 1 | Comparative Example 2 | Comparative Example 3 | Comparative Example 4 | Comparative Example 5 |
|---|---|---|---|---|---|---|---|
| Layer compo- sition | Film substrate | | PET | PET | PET | PET | PET |
|  | Inorganic layer | | Silicon oxide | Silicon oxide | Al oxide | — | Silicon oxide |
|  | Coat layer | Film thickness (μm) | — | 0.5 | 1.0 | 3.0 | 0.5 |
|  |  | PU vs SC mass ratio PU/SC | — | 100/0 | 96/4 | 98/2 | 98/2 |
|  |  | Reaction product of PU and SC Number-average molecular weight (Mn) | — | — | 60,000 | 80,000 | 80,000 |
|  |  | Reaction product of PU and SC Weight-average molecular weight (Mw) | — | — | 320,000 | 480,000 | 480,000 |
|  |  | Reaction product of PU and SC Polydispersity (Mw/Mn) | — | — | 5.3 | 6.0 | 6.0 |
| Barrier property | Before pressurised hot water treatment | Oxygen permeability (mL/m$^2$/24 hr/MPa) | 5.9 | 5.0 | 5.0 | 150 | 5.6 |
|  |  | Water vapor permeability (g/m$^2$/24 hr) | 0.4 | 0.5 | 0.5 | 25 | 0.7 |
|  |  | Laminate strength (g/15-mm width) | 670 | 650 | 650 | 600 | 750 |
|  |  | Water resistant laminate strength (g/15-mm width) | 580 | 260 | 260 | 650 | 700 |
|  | After pressurised hot water treatment | Oxygen permeability (mL/m$^2$/24 hr/MPa) | 13.1 | 5.4 | 5.2 | 300 | 13.6 |
|  |  | Water vapor permeability (g/m$^2$/24 hr) | 1.0 | 1.8 | 5.0 | 35 | 1.7 |
|  |  | Water resistant laminate strength (g/15-mm width) | 430 | 600 | 600 | 700 | 780 |

*PU: polyurethane-based resin, SC: silane coupling agent

INDUSTRIAL APPLICABILITY

The gas barrier laminate film of the present invention can be widely used for wrapping of articles which require blocking of various gases such as water vapor and oxygen, for example, for wrapping to avoid deterioration of foods, industrial goods, drugs, and the like. In addition to the wrapping use, this may also find the uses including for a vacuum insulating material and for a transparent conductive sheet to be used for a liquid crystal display device, a solar cell, an electromagnetic wave shield, a touch panel, a substrate for EL, a color filter, and the like.

The invention claimed is:

1. A gas barrier laminate film, comprising:
   a plastic substrate (A);
   a silicon oxide layer (B) formed on at least one surface of the plastic substrate (A); and
   a coat layer (C) formed by applying a coating solution onto a surface of the silicon oxide layer (B),
   wherein
   the coating solution comprises a polyurethane-based resin (c1), a silane coupling agent (c2), and a reaction product of (c1) with (c2) wherein said reaction product of (c1) with (c2) constitutes 50% or more by mass, in the entirety of the constituting components of the resin composition to constitute said coat layer (C), and a number-average molecular weight of the reaction product is in the range of 100,000 to 1,000,000, and an oxygen permeability of the gas barrier laminate film is 4 $mL/m^2$/24-hours/MPa or less.

2. The gas barrier laminate film according to claim 1, wherein the polyurethane-based resin (c1) is obtained by reaction of a polyol and a polyisocyanate, and the polyisocyanate is at least one selected from the group consisting of xylylene diisocyanate and hydrogenated xylylene diisocyanate.

3. The gas barrier laminate film according to claim 1, wherein the coating solution is a mixture of the polyurethane-based resin (c1) and the silane coupling agent (c2) with a mass ratio of in the range of 99/1 to 80/20.

4. The gas barrier laminate film according to claim 1, wherein the silane coupling agent (c2) is at least one selected from the group consisting of an epoxy group-containing silane compound and an amino group-containing silane compound.

5. The gas barrier laminate film according to claim 1, wherein the silicon oxide layer (B) is formed by a physical vapor deposition method or a chemical vapor deposition method.

6. The gas barrier laminate film according to claim 1, wherein an anchor coat layer is formed between the plastic substrate (A) and the silicon oxide layer (B).

7. The gas barrier laminate film according to claim 6, wherein the anchor coat layer is formed by at least one resin selected from the group consisting of a polyester-based resin, a polyurethane-based resin, an acryl-based resin, and an oxazoline group-containing resin.

8. The gas barrier laminate film according to claim 1, wherein a water vapor permeability is 0.5 $g/m^2$/24-hours or less.

9. The gas barrier laminate film according to claim 1, wherein the oxygen permeability of the gas barrier laminate film is 2 $mL/m^2$/24-hours/MPa or less.

10. The gas barrier laminate film according to claim 1, wherein the oxygen permeability of the gas barrier laminate film after a pressurized hot water treatment is 3 $mL/m^2$/24-hours/MPa or less.

11. The gas barrier laminate film according to claim 1, wherein the water vapor permeability of the gas barrier laminate film after a pressurized hot water treatment is 1 $mL/m^2$/24-hours/MPa or less.

12. The gas barrier laminate film according to claim 1, wherein the thickness of the coat layer (C) is in the range of 0.1 to 10 μm.

13. The gas barrier laminate film according to claim 1, wherein the thickness of the coat layer (C) is in the range of 0.5 to 1.0 μm.

* * * * *